United States Patent
Nishikawa

(12) 
(10) Patent No.: US 6,636,108 B2
(45) Date of Patent: Oct. 21, 2003

(54) FILTER CIRCUIT AND ELECTRONIC DEVICE USING THE SAME

(75) Inventor: Hiroshi Nishikawa, Omihachiman (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 40 days.

(21) Appl. No.: 10/125,532

(22) Filed: Apr. 19, 2002

(65) Prior Publication Data

US 2002/0175748 A1 Nov. 28, 2002

(30) Foreign Application Priority Data

May 17, 2001 (JP) .................................... 2001-147567
Feb. 6, 2002 (JP) .................................... 2002-029775

(51) Int. Cl.$^7$ ............................................. H03B 1/00
(52) U.S. Cl. ........................................................ 327/552
(58) Field of Search ................................ 327/551, 552, 327/556, 557, 558, 559

(56) References Cited

U.S. PATENT DOCUMENTS

| | | | | | |
|---|---|---|---|---|---|
| 3,593,175 | A | * | 7/1971 | Paine et al. | 330/107 |
| 3,605,032 | A | * | 9/1971 | Kerwin | 330/107 |
| 4,291,286 | A | * | 9/1981 | Wagner | 333/166 |
| 4,560,963 | A | * | 12/1985 | Sharpe | 333/172 |
| 4,684,832 | A | * | 8/1987 | Little et al. | 327/552 |
| 4,833,420 | A | * | 5/1989 | Ramet | 330/107 |
| 5,959,510 | A | * | 9/1999 | Moschytz | 333/172 |

FOREIGN PATENT DOCUMENTS

| JP | 8-265081 | 10/1996 |
|---|---|---|
| JP | 10-93370 | 4/1998 |

OTHER PUBLICATIONS

Sudou, Shirou, "Notch Characteristics Using Uniformly Distributed RC Line and the Applications to Active Filters", Technical Reports of IEICE, Sep. 1996, p. 59–66.

* cited by examiner

*Primary Examiner*—Jeffrey Zweizig
(74) *Attorney, Agent, or Firm*—Keating & Bennett, LLP

(57) ABSTRACT

A filter circuit includes a first distributed parameter RC circuit having a first distributed parameter resistor and a first distributed parameter capacitance and a second distributed parameter RC circuit having a second distributed parameter resistor and a second distributed parameter capacitance, wherein one end of each of the first and second distributed parameter resistors connected in parallel is connected to an input terminal of a buffer circuit and the second distributed parameter capacitance is connected to an output terminal of the buffer circuit, and when the number of distributed parameter RC circuits connected in parallel is n, which can be two or more, the number of distributed parameter capacitances connected to the output terminal of the buffer circuit is one to n−1.

20 Claims, 10 Drawing Sheets

FILTER CIRCUIT AND ELECTRONIC DEVICE USING THE SAME

BACKGROUND OF THE INVENTION

1. Field of the Invention

The present invention relates to a filter circuit and an electronic device using the same, and more particularly, the present invention relates to a filter circuit including a distributed parameter RC circuit having a distributed parameter resistor and a distributed parameter capacitance, and a buffer circuit, and to an electronic device including such a filter circuit.

2. Description of the Related Art

An exemplary filter circuit having a distributed parameter resistor and a distributed parameter capacitance is disclosed in Japanese Unexamined Patent Application Publication No.8-265081, for example. FIG. 15 shows the exemplary filter circuit of this device. Further, a chip filter shown in FIG. 16, which uses the above-described filter circuit and has a notch characteristic, is disclosed in the same Japanese Unexamined Patent Application Publication. This chip filter 1 includes an internal electrode 3 disposed in a chip 2 which is defined by a dielectric material and two resistor layers 4a and 4b arranged so as to oppose the internal electrode 3.

Further, the chip filter 1 includes an electrode 5a connected to one end of the resistor layer 4a, an electrode 5b connected to the other end of the resistor layer 4a, an electrode 5c connected to one end of the resistor layer 4b and to the internal electrode 3, and an electrode 5d connected to the other end of the resistor layer 4b. FIG. 17 is the equivalent circuit diagram of the above-described chip filter 1. The chip filter 1 can adjust the filtering characteristic thereof by providing the resistor layer 4b with a slit as shown in FIG. 18.

FIG. 19 shows the configuration of another filter disclosed in Japanese Unexamined Patent Application Publication No. 10-93370. This filter 1 includes a dielectric layer 7a on one surface of a layer 6 and a dielectric layer 7b on the other surface of the layer 6. The filter 1 also includes electrode layers 8a and 8b sandwiching the dielectric layers 7a and 7b so that the electrode layers 8a and 8b oppose the resistor layer 6. FIG. 20 is the equivalent circuit diagram of the filter 1 including distributed parameter capacitances provided on both sides of a distributed parameter resistor. The filter circuit shown in FIG. 17 achieves a notch characteristic indicated by the dotted line shown in FIG. 21. However, the filter circuit shown in FIG. 20, which includes the distributed parameter capacitances on both sides of the distributed parameter resistor, can achieve a steep notch characteristic indicated by the solid line shown in FIG. 21. Further, the filter circuit having an active device as shown in FIG. 22 can achieve a notch characteristic that is steeper than in the above-described case.

The filter shown in FIGS. 16 and 18 is small in size and can adjust the filtering characteristic thereof by using a resistor layer having a slit formed on the chip. However, the filter cannot obtain a steep notch characteristic. More specifically, the attenuation of the higher frequency side adjacent to the notch is small. Although the filter can adjust the filtering characteristic thereof by using the resistor layer 4b having the slit shown in FIGS. 16 and 18, the adjustment is limited since the resistor thereof for defining the distributed parameter RC circuit has no slits.

Further, the filter shown in FIG. 19 cannot adjust the filtering characteristic thereof by using a resistor layer with a slit, since the resistor is disposed within the device. If the filter had a resistor layer with a slit, this type of distributed parameter filter has only one resistance. That is to say, the parameter of the filter for adjusting the filtering characteristic such as a cutoff frequency and the notch characteristic is limited.

SUMMARY OF THE INVENTION

In order to overcome the problems described above, preferred embodiments of the present invention provide a filter circuit which can achieve a steep notch characteristic and which has many parameters and thereby easily adjusts the filtering characteristic thereof, and an electronic device including such a novel filter circuit.

According to a first preferred embodiment of the present invention, a filter circuit includes n (n are positive numbers and n≧2) distributed parameter RC circuits each having a distributed parameter resistor and a distributed parameter capacitance disposed along the distributed parameter resistor, and a buffer circuit. The distributed parameter resistors are connected in parallel at a first node and a second node, the second node is connected to an input terminal of the buffer circuit, and one to n−1 distributed parameter capacitances of the n distributed parameter RC circuits are connected to an output terminal of the buffer circuit.

According to a second preferred embodiment of the present invention, a filter circuit includes a dielectric layer, distributed parameter resistors including n (n≧2) resistor layers disposed on one surface of the dielectric layer, distributed parameter capacitances distributed along the distributed parameter resistors including n electrode layers arranged on the other surface of the dielectric layer so that the n electrode layers oppose the respective distributed parameter resistors, and a buffer circuit. In this filter circuit, first ends of the n resistor layers are electrically connected to each other and second ends of the n resistor layers are electrically connected to each other so that the distributed parameter resistors are connected in parallel. The second ends of the n connected resistor layers are connected to an input terminal of the buffer circuit, and one to n−1 electrode layers are connected to an output terminal of the buffer circuit.

According to a third preferred embodiment of the present invention, an electronic device includes a filter circuit according to one of the preferred embodiments of the present invention described above.

FIGS. 23 and 24 show generally used filter circuits having a notch characteristic by using the distributed parameter RC circuit shown in FIG. 15. The transfer function F(s) of these circuits is shown by the following equation:

$$F(s) = \frac{\alpha + \sqrt{sCR}\ \sinh\sqrt{sCR}}{\alpha\cosh\sqrt{sCR} + \sqrt{sCR}\ \sinh\sqrt{sCR}}$$

wherein R indicates the overall resistance of the distributed parameter RC circuit, C indicates the overall capacitance thereof, and R0 and C0 respectively indicate the resistor and the capacitor.

Here, α=R/R0, or α=C/C0. According to the above equation, the filtering characteristic of the filter circuit shows the notch characteristic as indicated by the dotted line shown in FIG. 21. By replacing a single feedback obtained by the capacitor shown in FIG. 24 with a distributed parameter-type multiple feedback shown in FIG. 25, the steep notch characteristic indicated by the solid line shown in FIG. 21 can be obtained.

As has been described, the steep notch characteristic can be achieved by using the plurality of distributed parameter RC circuits connected in parallel and the buffer circuit. More specifically, for obtaining such steep notch characteristic, the n (n≧2) distributed parameter RC circuits connected in parallel are used with the buffer circuit, for example. One end of each of n distributed parameter resistors is connected to the input terminal of the buffer circuit, and one to n−1 distributed parameter capacitances are connected to the output terminal of the buffer circuit. Further, by adjusting the distributed parameter resistors, the filtering characteristic can be adjusted. Since the plurality of distributed parameter RC circuits is connected in parallel, there is the plurality of adjustable distributed parameter resistors. In other words, there are many parameters for performing fine adjustment of the filtering characteristic.

This filter circuit includes the plurality of resistor layers sandwiching the dielectric layer and the plurality of electrode layers. In this case, the filter circuit can adjust the resistance of the distributed parameter RC circuits by creating a slit in the resistor layers. Since the shape of the electrode layers and the resistor layers can be changed at will, it becomes easy to trim the filter circuit. Further, the electronic device including such a filter circuit can perform predetermined desired operations because of the suitable filtering characteristic of the filter circuit.

The above-described and other features, elements, characteristic, and advantages of the present invention will become more apparent from the following detailed description of preferred embodiments with reference to the drawings.

DETAILED DESCRIPTION OF PREFERRED EMBODIMENTS

Figure 1:
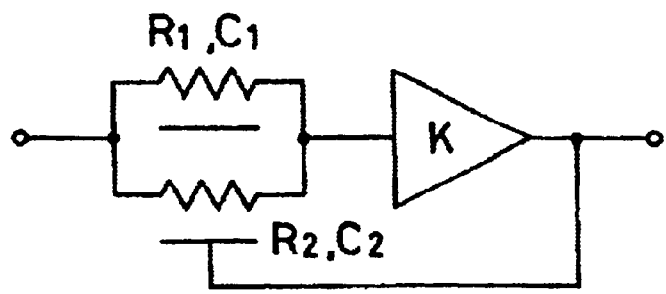
FIG. 1 is a circuit diagram of an exemplary filter circuit according to a preferred embodiment of the present invention.

The filter circuit 10 shown in FIG. 1 preferably includes a first distributed-parameter RC circuit having a distributed parameter resistor R1 and a distributed parameter capacitance C1 disposed between the distributed parameter resistor R1 and a first electrode arranged along the distributed parameter resistor R1. The filter circuit 10 also includes a second distributed-parameter RC circuit having a distributed parameter resistor R2 and a distributed parameter capacitance C2 disposed between the distributed parameter resistor R2 and a second electrode arranged along the distributed parameter resistor R2. The distributed-parameter resistor R1 and the distributed-parameter resistor R2 are connected in parallel. One end of each of the connected distributed-parameter resistors R1 and R2 is connected to an input terminal of a buffer circuit K. The distributed parameter capacitance C2, that is, the second electrode for defining the distributed parameter capacitance C2 is connected to an output terminal of the buffer circuit K.

Figure 2:
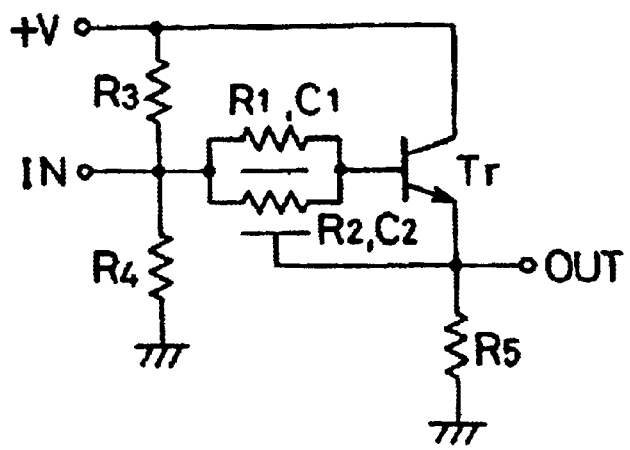
FIG. 2 is a circuit diagram of the filter circuit shown in FIG. 1 wherein a transistor is used for a buffer circuit.

FIG. 2 shows another exemplary filter circuit. This filter circuit further includes an emitter-follower circuit of a transistor Tr, which is used for the buffer circuit K. This filter circuit further includes a series circuit having a resistor R3 and a resistor R4, and a resistor R5.

One end of each of the connected distributed parameter resistors R1 and R2 is connected to a base of the transistor Tr. A collector of the transistor Tr is connected to a power supply +V and is connected to ground via the series circuit having the resistor R3 and the resistor R4. Each connection unit of the resistors R3 and R4 is connected to another end of the connected distributed parameter resistors R1 and R2, and is used as an input port IN. An emitter of the transistor Tr is connected to ground via the resistor R5 and is connected to the distributed parameter capacitance C2. The emitter of the transistor Tr is used as an output port OUT.

Figure 3:
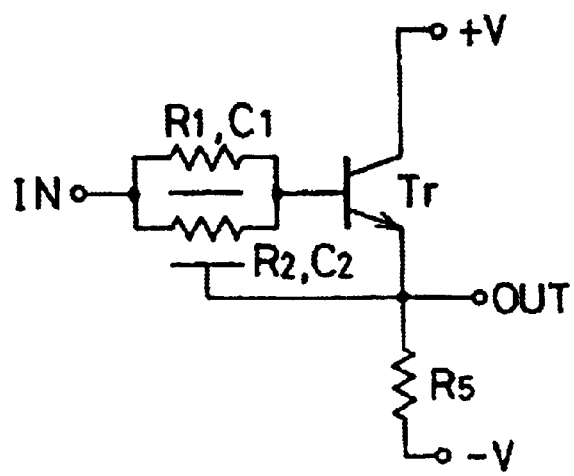
FIG. 3 is a circuit diagram of an exemplary filter circuit having a positive power supply and a negative power supply.

In this filter circuit shown in FIG. 2, the voltage of the power supply +V is divided by the resistors R3 and R4 and is used as a bias for the transistor Tr. However, FIG. 3 shows another exemplary filter circuit. This filter circuit also includes another power supply −V having a polarity that is opposite to that of the power supply +V. In such case, the resistors R3 and R4 become unnecessary. The power supply +V is connected to the collector of the transistor Tr and the power supply −V is connected to the resistor R5. When a signal is input in the input port IN, a signal of a predetermined frequency is output from the output port OUT.

Figure 4:
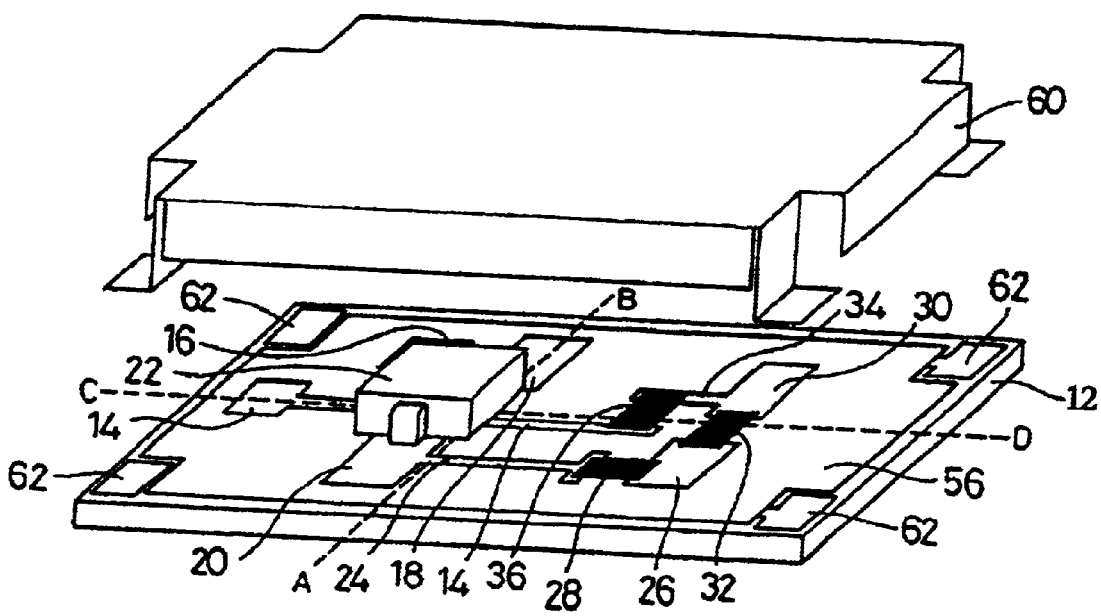
FIG. 4 is a perspective view of an exemplary filter circuit device having the circuit shown in FIG. 2.

FIG. 4 is a perspective view of an exemplary filter according to preferred embodiments of the present invention. The filter includes an alumina substrate 12. On one surface of the alumina substrate 12, an electrode 14 is arranged so as to extend from one lengthwise end of the alumina substrate 12 to the other. The electrode 14 is connected to a land 16 between the two lengthwise ends. A land 18 is located adjacent to the land 16. Further, a land 20 is located near the land 16 and the land 18. A transistor 22 used as an element of the buffer circuit is disposed on these three lands 16, 18, and 20. The emitter of the transistor 22 is connected to the land 16, the base thereof is connected to the land 18, and the collector thereof is connected to the land 20.

An electrode 24 is arranged so as to extend from the land 20 substantially parallel to the electrode 14. A land 26 is disposed at a certain distance from one end of the electrode 24. A resistor layer 28 functioning as the resistor 3 is disposed between the electrode 24 and the land 26. Further, a land 30 is disposed at a certain distance from the land 26. A resistor layer 32 functioning as the resistor R4 is disposed between the land 26 and the land 30. An electrode 34 is arranged so as to extend from the land 30 substantially parallel to the electrode 14. A resistor layer 36 that functions as the resistor R5 is disposed between the electrode 14 and the electrode 34.

Figure 5:
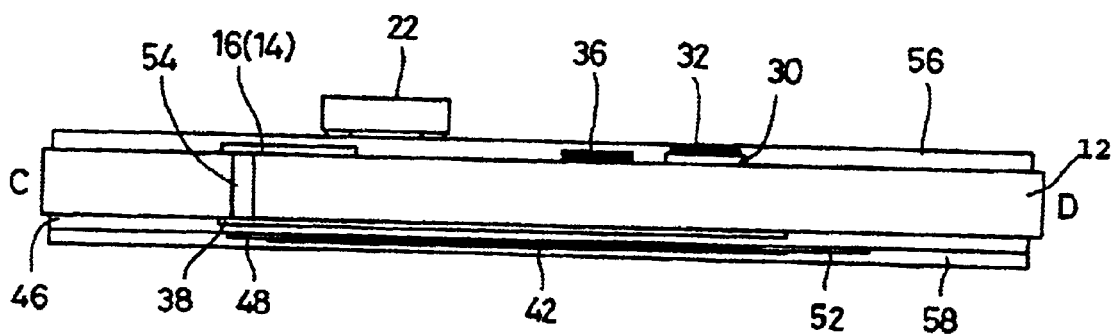
FIG. 5 is a sectional view of the exemplary filter circuit device shown in FIG. 4 taken along the line C-D.
Figure 6:
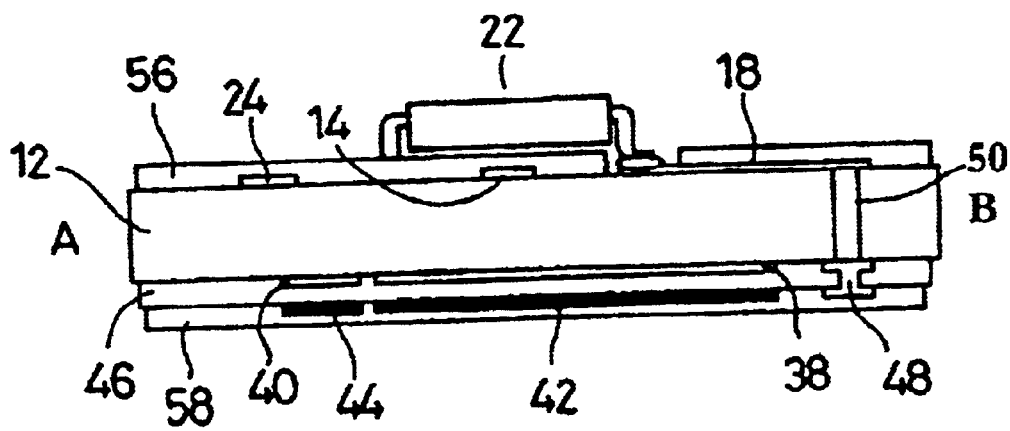
FIG. 6 is a sectional view of the exemplary filter circuit device shown in FIG. 4 taken along the line A-B.

As shown in FIG. 5 and FIG. 6, on the other surface of the alumina substrate 12, an electrode layer 38 and an electrode layer 40, and a resistor layer 42 and a resistor layer 44 are disposed to define the distributed parameter resistors R1 and R2 and the distributed parameter capacitances C1 and C2. The electrode layers 38 and 40 are disposed on the other surface of the alumina substrate 12, and the resistor layers 42 and 44 are defined by a dielectric layer 46 made of, for example, a glass dielectric material. The electrode layer 38 and the resistor layer 42 are arranged so as to oppose each other, and the electrode layer 40 and the resistor 44 are arranged so as to oppose each other. Accordingly, the resistor layer 42 defines the distributed parameter resistor R1, and the resistor layer 44 defines the distributed parameter resistor R2. Further, the distributed parameter capacitance C1 is disposed between the electrode layer 38 and the resistor layer 42 and the distributed parameter capacitance C2 is disposed between the electrode layer 40 and the resistor layer 44.

Figure 7:
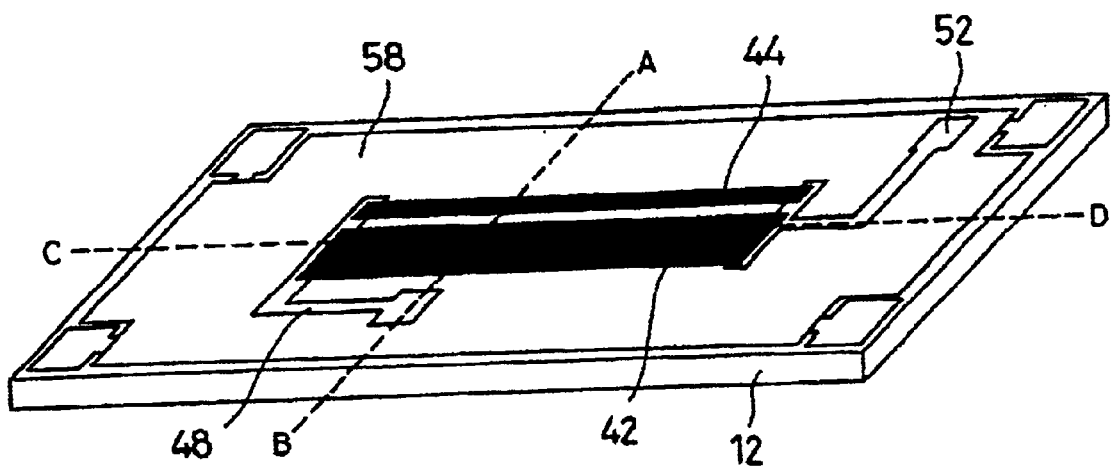
FIG. 7 is a perspective view of the filter circuit device shown in FIG. 4 viewed from the other surface.

As shown in FIG. 7, an electrode 48 is disposed on the other surface of the alumina substrate 12 so as to connect one end of the resistor layer 42 with that of the resistor 44. This electrode 48 is connected to the land 18 via a through hole 50 formed in the alumina substrate 12. Further, an electrode 52 is also arranged so as to connect the other end of the resistor layer 42 with that of the resistor 44. This electrode 52 is connected to the land 26 via a through hole (not shown) formed in the alumina substrate 12. The land 16 to which the emitter of the transistor 22 is connected is connected to the electrode layer 38 via a through hole 54 formed in the alumina substrate 12 as shown in FIG. 5.

On one surface and the other surface of the alumina substrate 12, a cover film 56 and a cover film 58, which are preferably made of glass, are respectively arranged so as to cover the resistor layers and the electrodes. Further, a metal case 60 is placed on one surface of the alumina substrate 12. The metal case 60 is fixed to external electrodes 62 disposed on four corner parts of the alumina substrate 12 by, for example, soldering. In this filter circuit device, as the electrode layers 38 and 40 defining the distributed parameter RC circuit and as the electrode disposed on the alumina substrate 12, a silver thick-film electrode is preferably used, for example. Further, as the resistor layers 42 and 44 defining the distributed parameter RC circuit and as the resistor layers 28, 32, and 36 that are disposed on the alumina substrate 12, a cermet thick-film resistor is preferably used, for example.

The above-described filter circuit 10 can achieve a steep notch characteristic since it has the plurality of distributed parameter RC circuits connected in parallel. However, by using a buffer circuit including the transistor 22, the filter circuit 10 can achieve a notch characteristic that is steeper than in the case where the buffer circuit including the transistor 22 is not used. The exemplary filter circuit 10 shown in FIGS. 4 to 7 can achieve a low-pass filtering characteristic having a steep notch characteristic where a cutoff frequency ranges from several megahertz to several hundred megahertz, by making the overall resistance in the distributed parameter RC circuits range from several hundred ohms to several tens of kilo-ohms.

Figure 8:
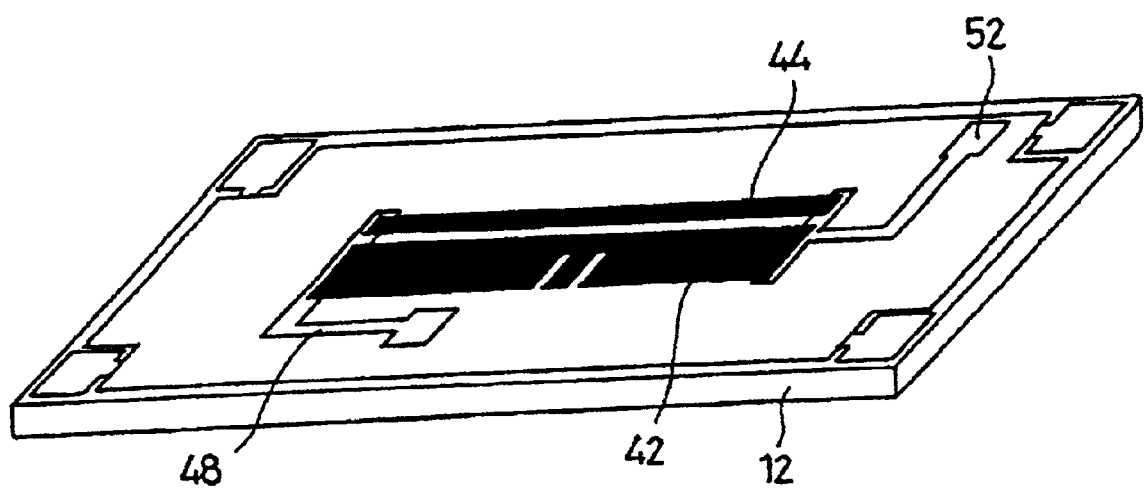
FIG. 8 shows the resistor layers of the filter circuit device shown in FIG. 7 after trimming.
Figure 9:
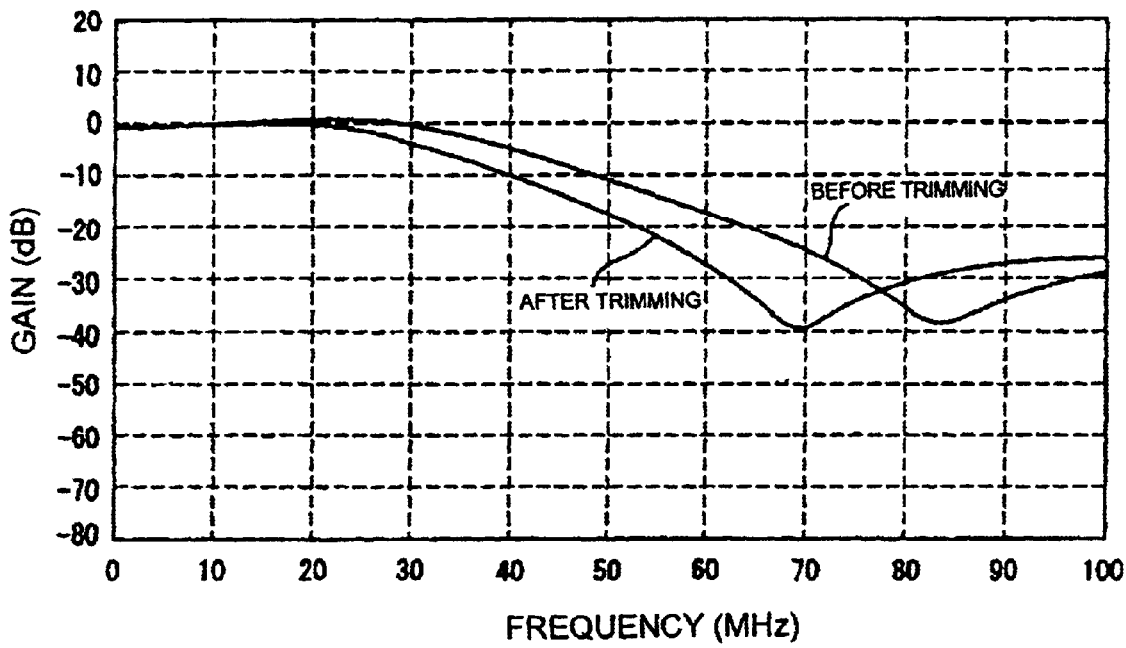
FIG. 9 shows a graph for describing the filtering characteristic of the filter circuit before trimming the resistor layers and the filtering characteristic thereof after trimming the resistor layers.

The filter circuit 10 can adjust the filtering characteristic thereof by, for example, trimming the resistor layer 42 defining the distributed parameter RC circuit as shown in FIG. 8. The trimming is performed by irradiating laser light on the resistor layer 42, whereby the resistance thereof is increased and the cutoff frequency and an attenuation-pole frequency can be shifted to the lower frequency side, as shown in FIG. 9.

The above-described adjustment can also be performed by trimming the resistor layer 44, whereby the resistance thereof is increased and the cutoff frequency and the attenuation-pole frequency can be shifted to the lower frequency side. Since the distributed parameter RC circuits connected in parallel provide two adjustable parameters, it becomes possible to perform fine adjustment of the filtering characteristic.

Figure 10:
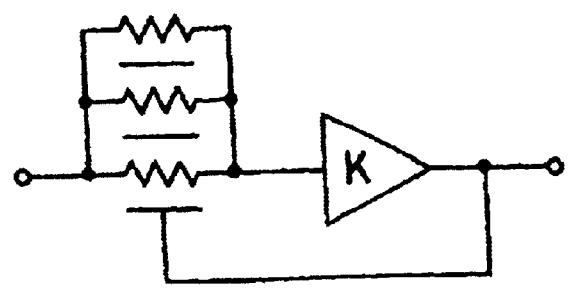
FIG. 10 shows an exemplary filter circuit diagram having three distributed parameter RC circuits connected in parallel.
Figure 11:
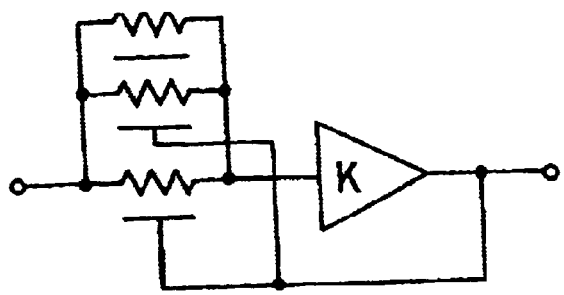
FIG. 11 is another exemplary filter circuit diagram having three distributed parameter RC circuits connected in parallel.

Further, the filter circuit 10 may include three or more distributed parameter RC circuits connected in parallel. In a case as shown in FIG. 10, three distributed parameter resistors defining the three distributed parameter RC circuits are connected to the input port of the buffer circuit K. Further, a distributed parameter capacitance of one of the distributed parameter RC circuits is connected to the output port of the buffer circuit. In another case, two distributed parameter capacitances of two distributed parameter RC circuits may be connected to the output port of the buffer circuit as shown in FIG. 11.

When n distributed parameter RC circuits are connected in parallel, the number of distributed parameter capacitance connected to the output port of the buffer circuit is from one to n−1. When many distributed parameter RC circuits are connected in parallel, the number of the resistor layers that can be trimmed is increased, and the number of distributed parameter capacitance connected to the output port of the buffer circuit can be adjusted. That is to say, the number of adjustable parameters can be increased by increasing the number of distributed parameter RC circuits connected in parallel.

Figure 12:
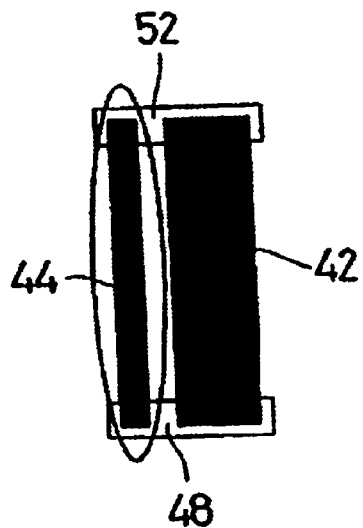
FIG. 12 is a plan view showing the shape of an exemplary distributed parameter RC circuit element.
Figure 13:
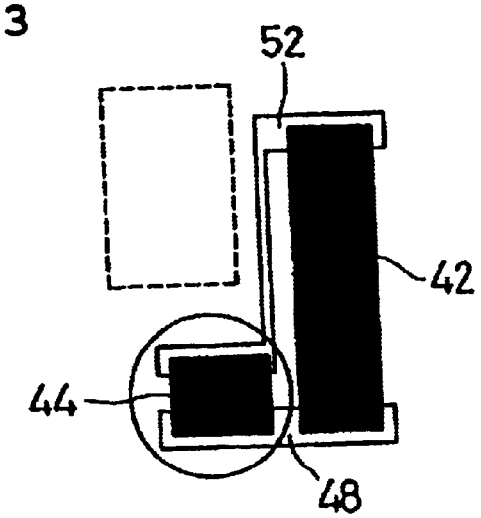
FIG. 13 is a plan view showing the shape of another exemplary distributed parameter RC circuit element.
Figure 14:
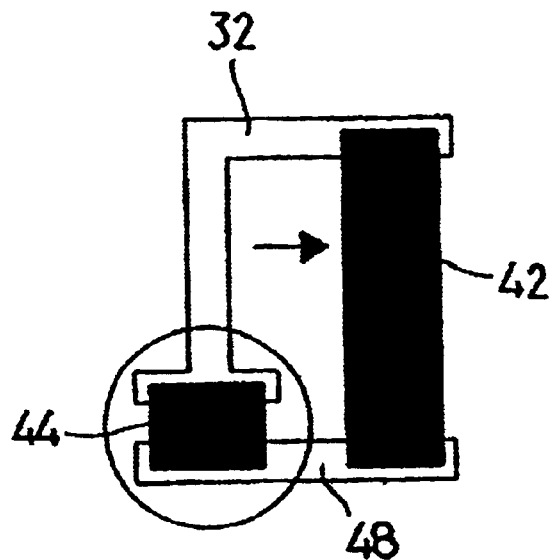
FIG. 14 is a plan view showing the shape of a modified electrode for connecting the distributed parameter RC circuit elements.
Figure 15:
FIG. 15 shows an equivalent circuit of one example of known distributed parameter RC circuit element.
Figure 16:
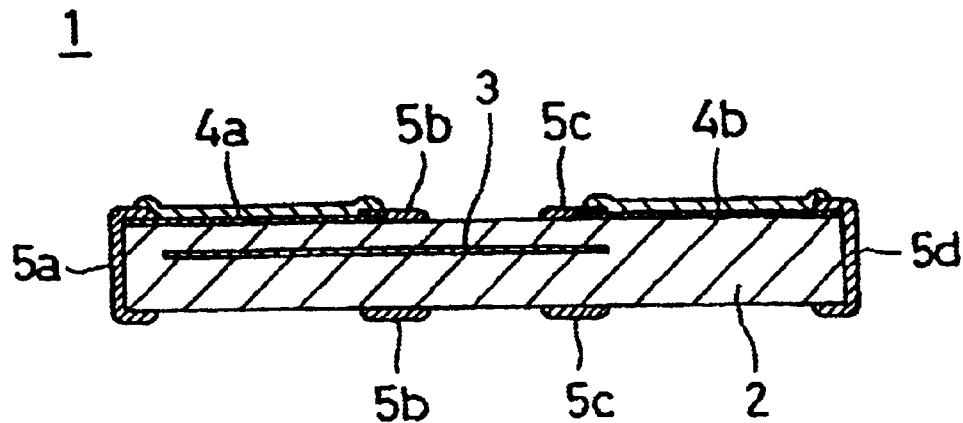
FIG. 16 is a sectional view of a filter having the known distributed parameter RC circuit element shown in FIG. 15.
Figure 17:
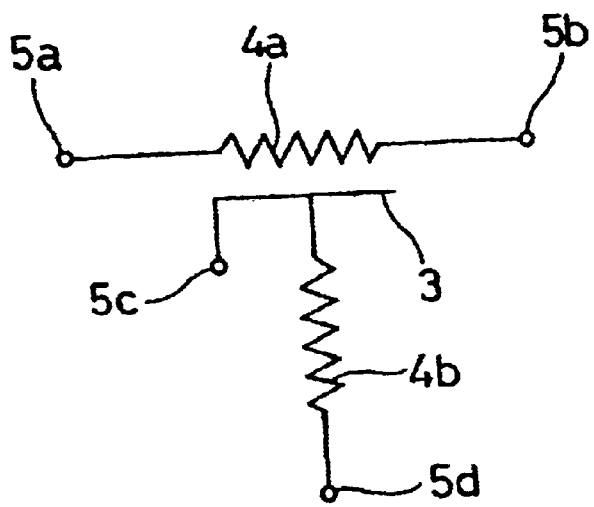
FIG. 17 is a circuit diagram of the filter shown in FIG. 16.
Figure 18:
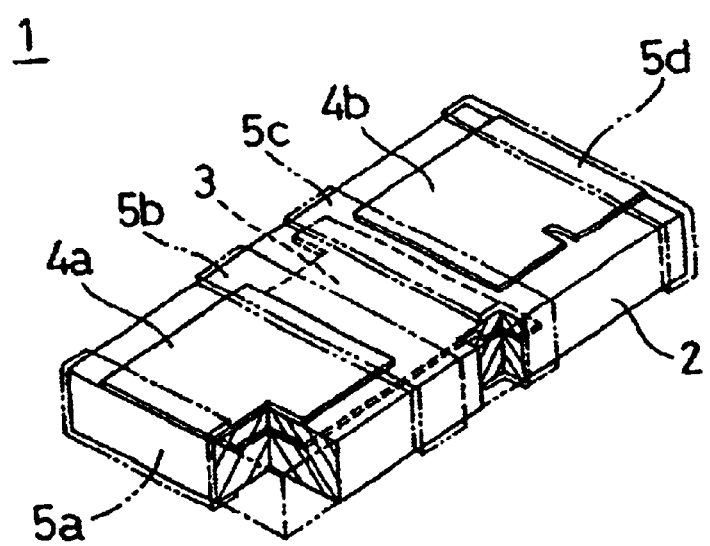
FIG. 18 shows a resistor layer of the known filter shown in FIG. 16 after trimming.
Figure 19:
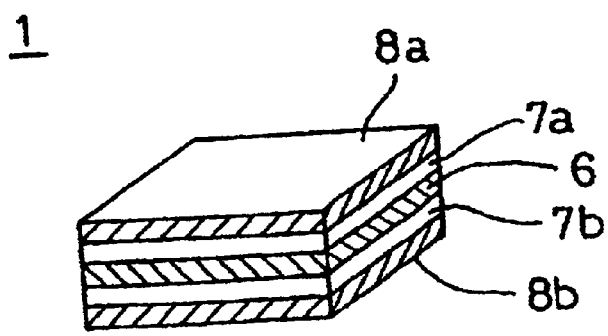
FIG. 19 shows another example of the known distributed parameter RC circuit element used as a filter.
Figure 20:
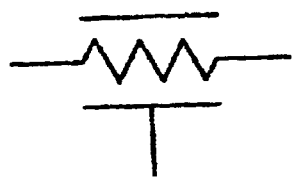
FIG. 20 is an equivalent circuit of the distributed parameter RC circuit shown in FIG. 19.
Figure 21:
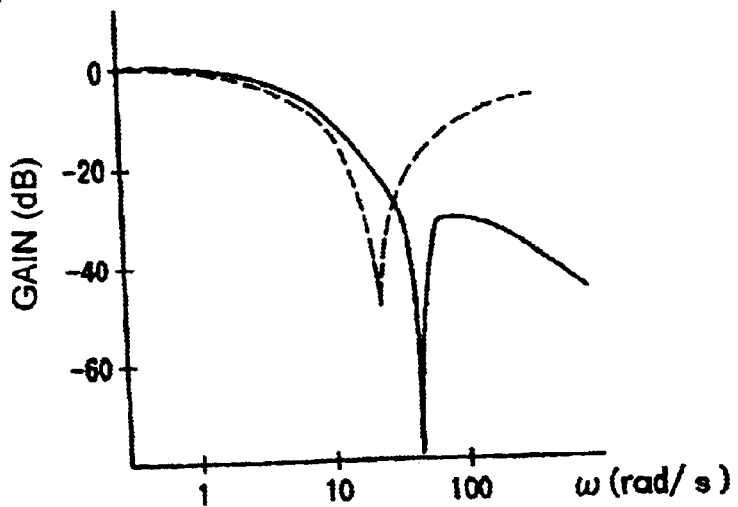
FIG. 21 shows a graph showing the filtering characteristics of the filter circuits respectively shown in FIG. 17 and FIG. 20.
Figure 22:
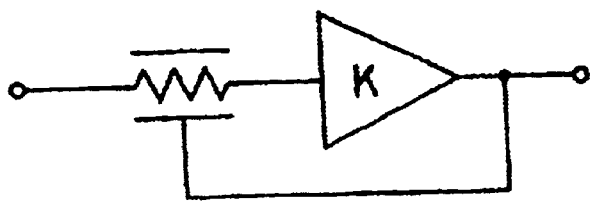
FIG. 22 is a circuit diagram showing the distributed parameter RC circuit shown in FIG. 20 and a buffer circuit.
Figure 23:
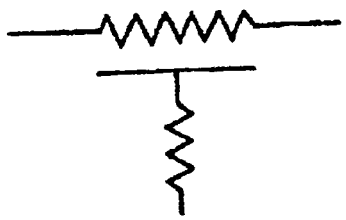
FIG. 23 is a circuit diagram of an exemplary filter circuit having a notch characteristic.
Figure 24:
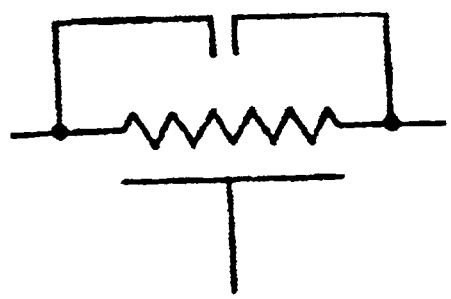
FIG. 24 is a circuit diagram of another exemplary filter having a notch characteristic.
Figure 25:
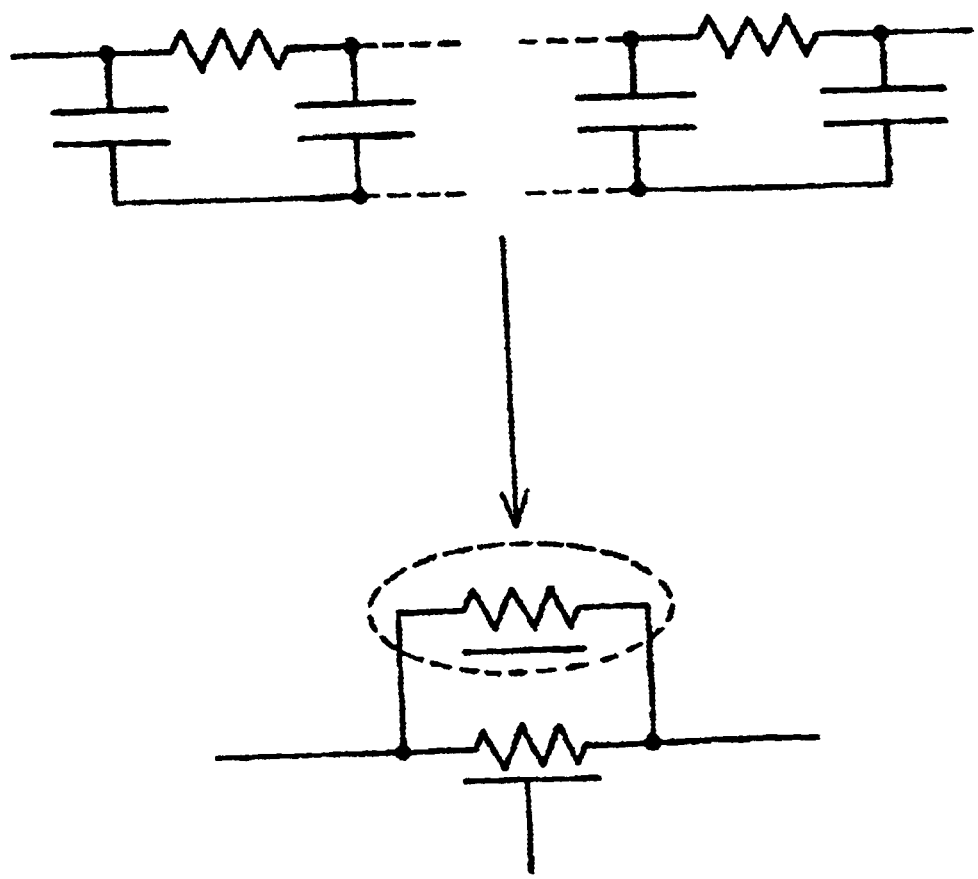
FIG. 25 is an equivalent circuit diagram of the filter circuit according to preferred embodiments of the present invention where distributed parameter capacitances are used instead of a feedback loop disposed by the capacitor shown in FIG. 24.

As shown in FIG. 12, the resistor layer 44 and the resistor layer 42 are constructed so as to be almost equal with each other in the length. Further, an electrode of a distributed parameter RC circuit and another electrode of another distributed parameter RC circuit are also constructed so as to be almost equal with each other in the length. However, as shown in FIG. 13, the resistor layer 44 and the electrode layer 40 (not shown in this figure) may be shorter than the resistor layer 42 and the electrode layer 38 (not shown in this figure). That is to say, the filtering characteristic of the filter circuit 10 does not change as long as the resistor layer 44 shown in FIG. 12 and the corresponding electrode layer 40 have the same area as that of the resistor layer 44 shown in FIG. 13 and the corresponding electrode layer 40. When the length of the resistor layer 44 is shorter than that of the resistor layer 42, a space can be provided adjacent to the resistor layer 42. Subsequently, it becomes possible to mount a related circuit in this space. Further, for trimming the resistor layer 42 from the resistor layer 44 side, the electrode 52, to which the resistor layers 42 and 44 are connected, may have the shape that is different from that of the above-described case as shown in FIG. 14. By forming the plurality of distributed parameter RC circuits separately, the shape of the electrode layer and the resistor layers can be freely adjusted whereby the filter circuit can be designed more freely.

As for the buffer circuit, two or more transistors connected by using a Darlington connection or an inverted Darlington connection may be used. Further, an operational amplifier may be used to define the buffer circuit.

The above-described filter circuit 10 can be used as an anti-aliasing/smoothing filter of an AD converter and a DA converter of a television, a video-tape recorder, and a DVD player, for example, and many other applications. The electronic devices including the filter circuit of the present invention can achieve a filtering characteristic suitable for their functions and thereby enhances the performance thereof.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A filter circuit comprising:
   n (n≧2) distributed parameter RC circuits each having a distributed parameter resistor and a distributed parameter capacitance arranged along the distributed parameter resistor; and
   a buffer circuit; wherein
   the distributed parameter resistors are connected in parallel at a first node and a second node, and the second node is connected to an input terminal of the buffer circuit, and one to n−1 distributed parameter capacitances of the n distributed parameter RC circuits are connected to an output terminal of the buffer circuit.

2. A filter circuit according to claim 1, wherein said buffer circuit includes an emitter-follower circuit of a transistor.

3. A filter circuit according to claim 2, further comprising a series circuit including a first resistor, a second resistor and a third resistor, wherein on end of said n distributed parameter resistors is connected to a base of the transistor, a collector of the transistor is connected to a power supply and is connected to ground via the first and second resistors, and an emitter of the transistor is connected to ground via the third resistor.

4. A filter circuit according to claim 2, wherein said buffer circuit includes a series circuit including a resistor, wherein a first power supply is connected to a collector of the transistor, and a second power supply having a polarity that is opposite to that of the first power supply is connected to the resistor.

5. A filter circuit according to claim 1, wherein one of the distributed parameter capacitances of the n distributed parameter RC circuits is connected to an output of the buffer circuit.

6. An electronic device comprising a filter circuit according to claim 1.

7. A filter circuit comprising:
   a dielectric layer;
   distributed parameter resistors including n (n≧2) resistor layers disposed on one surface of the dielectric layer;
   distributed parameter capacitances distributed along the distributed parameter resistors including n electrode layers arranged on the other surface of the dielectric layer so that the n electrode layers oppose the respective distributed parameter resistors; and
   a buffer circuit; wherein
   first ends of the n resistor layers are electrically connected to each other and second ends of the n resistor layers are electrically connected to each other so that the distributed parameter resistors are connected in parallel, the second ends of the n connected resistor layers are connected to an input terminal of the buffer circuit, and one to n−1 electrode layers are connected to an output terminal of the buffer circuit.

8. A filter circuit according to claim 7, wherein the dielectric layer is made of a glass dielectric material.

9. A filter circuit according to claim 7, further comprising an alumina substrate, wherein said dielectric layer, said distributed parameter resistors and said distributed parameter capacitances are arranged on one surface of said alumina substrate.

10. A filter circuit according to claim 9, wherein said buffer circuit includes a transistor provided on another surface of said alumina substrate.

11. A filter circuit according to claim 10, wherein an emitter of said transistor is connected to at least one of said n electrode layers via a through hole provided in the alumina substrate.

12. An electronic device comprising a filter circuit according to claim 7.

13. A filter comprising:
   an alumina substrate having two main surfaces;
   a plurality of electrode layers and a plurality of resistor layers provided on one of said main surfaces of said alumina substrate; and
   a buffer circuit provided on the other main surface of the alumina substrate; wherein
   said plurality of electrode layers and said plurality of resistor layers are disposed so as to oppose each other, such that the plurality of resistor layers define a plurality of distributed parameter resistors, and a plurality of distributed parameter capacitances are defined between the plurality of electrode layers and the plurality of resistor layers; and
   first ends of the plurality of resistor layers are electrically connected to each other and second ends of the plurality of resistor layers are electrically connected to each other such that the plurality of distributed parameter resistors are connected in parallel, the second ends of the plurality of connected resistor layers are connected to an input terminal of the buffer circuit, and at least one of the plurality of electrode layers are connected to an output terminal of the buffer circuit.

14. A filter according to claim 13, wherein said plurality of resistor layers are defined by cermet thick films.

15. A filter according to claim 14, wherein said dielectric layers are made of glass dielectric material.

16. A filter according to claim 13, wherein said buffer circuit includes a transistor, an emitter of said transistor is connected to at least one of the plurality of electrode layers via a through hole provided in the alumina substrate.

17. A filter according to claim 13, further comprising a cover film arranged to cover the plurality of electrode layers and the plurality of resistor layers.

18. A filter according to claim 17, wherein said cover film is made of glass.

19. A filter according to claim 13, wherein a metal case is provided on one of the main surfaces of the alumina substrate and fixed to external electrodes provided on corner portions of the alumina substrate.

20. An electronic device comprising a filter according to claim 13.

* * * * *